(12) United States Patent
Barnes

(10) Patent No.: US 6,580,648 B1
(45) Date of Patent: Jun. 17, 2003

(54) MEMORY CIRCUIT

(75) Inventor: William Bryan Barnes, Bristol (GB)

(73) Assignee: STMicroelectronics Limited, Almondsbury Bristol (GB)

( * ) Notice: Subject to any disclaimer, the term of this patent is extended or adjusted under 35 U.S.C. 154(b) by 12 days.

(21) Appl. No.: 09/743,782

(22) PCT Filed: May 12, 2000

(86) PCT No.: PCT/GB00/01806

§ 371 (c)(1), (2), (4) Date: Feb. 27, 2002

(87) PCT Pub. No.: WO00/70623

PCT Pub. Date: Nov. 23, 2000

(30) Foreign Application Priority Data

May 12, 1999 (GB) .............................. 9911043

(51) Int. Cl.$^7$ .............................. G11C 7/00; G11C 8/00
(52) U.S. Cl. .............. 365/189.02; 365/201; 365/230.02
(58) Field of Search ................. 365/189.02, 189.05, 365/189.08, 189.12, 201, 230.02, 230.08, 240; 714/724, 732, 733, 734

(56) References Cited

U.S. PATENT DOCUMENTS

| | | | | |
|---|---|---|---|---|
| 4,779,273 A | * | 10/1988 | Beucler et al. | 714/732 |
| 5,184,067 A | * | 2/1993 | Nozuyama | 714/732 |
| 5,572,536 A | * | 11/1996 | Thiruvengadam | 714/732 |
| 5,574,733 A | * | 11/1996 | Kim | 714/732 |
| 5,663,965 A | | 9/1997 | Seymout | |
| 5,872,794 A | * | 2/1999 | Cook et al. | 714/732 |
| 6,199,184 B1 | * | 3/2001 | Sim | 714/732 |
| 6,240,537 B1 | * | 5/2001 | Sim | 714/732 |

FOREIGN PATENT DOCUMENTS

| | | |
|---|---|---|
| EP | 0 350 538 A1 | 1/1990 |
| EP | 0 350 888 A2 | 1/1990 |

OTHER PUBLICATIONS

International Search Report from priority application No. WO 00/70623 filed May 12, 2000.

* cited by examiner

Primary Examiner—Trong Phan
(74) Attorney, Agent, or Firm—Wolf, Greenfield & Sacks, P.C.; James H. Morris; Robert A. Skrivanek, Jr.

(57) ABSTRACT

The present invention relates to a memory having sense amplifiers and data latches, the data latches being used in a test mode to form a signature register. In a normal operation mode, the data latches are form write data latches.

6 Claims, 4 Drawing Sheets

MEMORY CIRCUIT

1. Field of the Invention

The present invention relates to a memory circuit and more specifically such a circuit including a test arrangement for the memory. More particularly but not exclusively the memory circuit including built-in self-test circuitry.

2. Description of the Related Art

The increasing use of complex semiconductor chips creates problems for testing the functionality of those chips, and specifically in interfacing test equipment into the circuit.

Currently interest is centring upon the provision of embedded test circuitry, so-called "built-in self-test circuitry" which, in exchange for a one-time investment in the circuitry allows ready access to the elements circuits and systems of interest at high speed.

One technique which is used is to apply inputs derived from a pseudo-random pattern generator as a write information to a memory and then to read from the memory into a multiple-input signature register. A controller associated with the pattern generator allow repeated loading of patterns into the memory followed by logging out into the signature register.

The signature register is a known device, also known as a compression register, which accumulates the responses such that any deviation in the final state of the register at the end of a test indicates both the presence of a defect in the memory and also an indication of the location of that defect.

It will of course be understood that provision of circuitry dedicated to built-in self-test occupies chip area and furthermore needs suitable connecting conductors in order to interface with the circuitry to be tested.

It is accordingly an object of the present invention to provide a circuit which at least partially mitigates the difficulties of the prior art.

SUMMARY OF THE INVENTION

According to the present invention there is provided a memory circuit having a plurality of complementary bitlines, a corresponding plurality of sense amplifiers for evaluating the logic state of said bitline pairs, each sense amplifier having an output, and a corresponding plurality of data latches for storing data to be written to said bitline pairs, wherein each data latch has an input and output, the circuit further comprising a respective multiplexer connected to each data latch input, a first input of said multiplexer being responsive to the output of a respective other data latch, and a second input of said multiplexer receiving said data to be written whereby in one state of said multiplexer said data latches are connected to form a test register.

Preferably at least one of said multiplexers have an input responsive to an output of the corresponding sense amplifier.

Preferably the circuit further comprises a corresponding plurality of logic circuits, each having an output connected to the first input of a respective one of said multiplexers, a first input receiving the output of said another data latch and a second input receiving said output of the corresponding sense amplifier.

According to a second aspect of the invention, there is provided a method of operating a memory circuit having plural complementary bitlines a corresponding plurality of sense amplifiers for evaluating the logic state of said bitline pairs, each sense amplifier having an output, and a corresponding plurality of data latches for storing data to be written to said bitline pairs, wherein each data latch has an input and output comprising: in one mode providing data to be written to said memory at an input of each said data latch, whereby said data is written to said memory in a test mode, connecting the input of each data latch to the output of a preceding data latch.

Advantageously the circuit is operable to provide, at the output of a last data latch, a signature output and each said logic circuit has a third input responsive to said signature output.

BRIEF DESCRIPTION OF THE DRAWINGS

An embodiment of the invention will now be described with respect to the accompanying drawings in which.

In the various figures like reference numerals refer to like parts.

DETAILED DESCRIPTION

Figure 1:
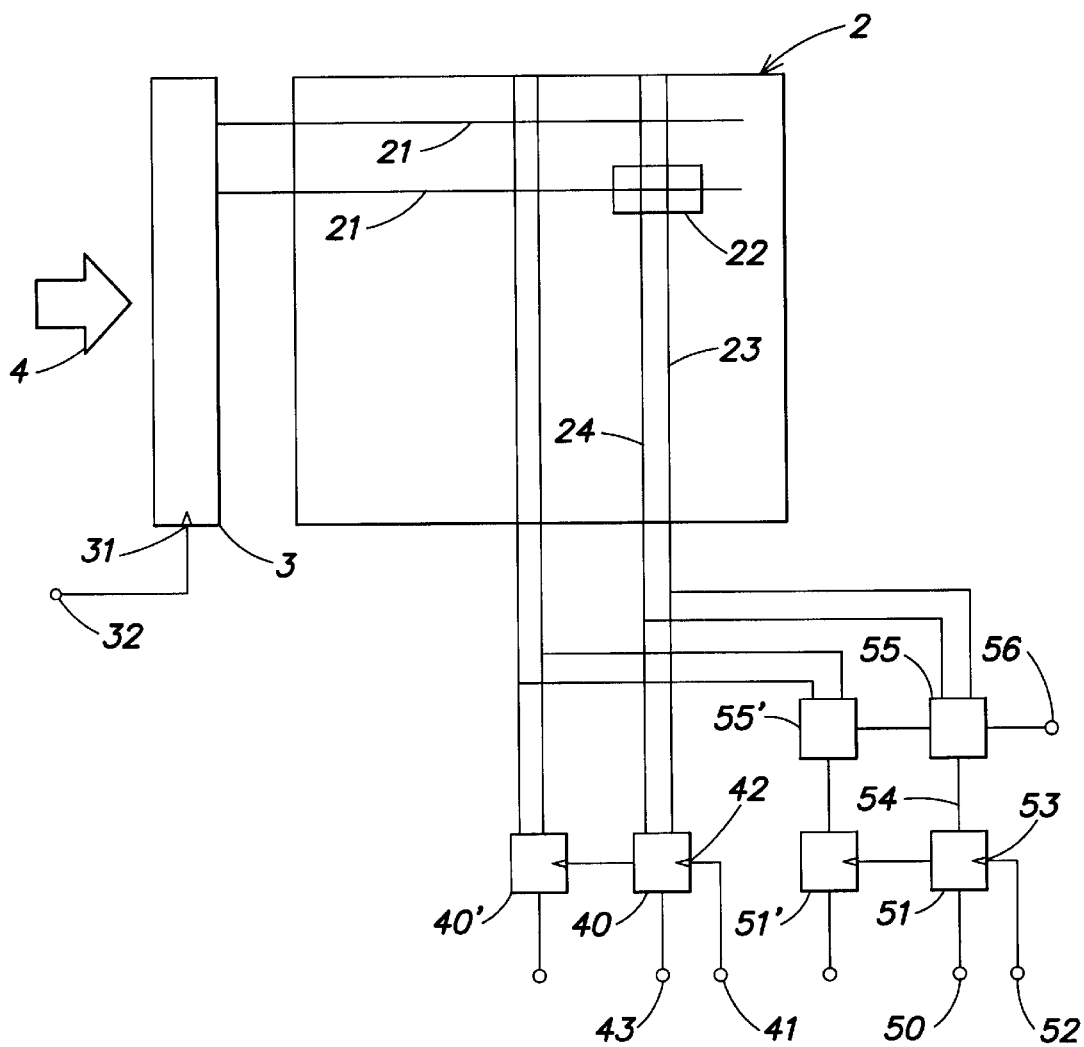
FIG. 1 shows a schematic diagram of a conventional semiconductor memory circuit.

Referring first to FIG. 1 a conventional semiconductor memory circuit comprises a matrix memory array 2 having a plurality of wordlines 21 forming rows of the array and a plurality of complementary pairs of bitlines 23, 24 forming columns of the array. At the junction of each row and column there is disposed a memory cell 22.

The wordlines 21 are energized from address register circuitry 3 which receives address information 4 and which has a clock input 31 receiving a clock signal 32.

In operation, to read from the memory address, information 4 is applied to the inputs of the address register circuitry 3 and, when the clock pulse 32 is applied, one or more bitlines 21 are energized. Accordingly, as known to those skilled in the art, corresponding memory cells 22 are activated and caused the complementary bitlines 23, 24 to differentially change in potential.

Each complementary bitline pair is connected to a respective sense amplifier 40 which evaluates the logic state on the complementary bitlines 23, 24 in response to a clock pulse 41 applied to clock inputs 42. One sense amplifier 40, 40' is provided per bitline pair.

The sense amplifiers 40, 40' are actuated by the clock pulse 41 at a sufficient time after actuation of the wordlines 21 to allow a sufficiently high differential potential to arise on the complementary bitlines, so that any differential offset in the sense amplifier 40, 40' can be overcome. The sense amplifiers 40, 40' are formed with a latching output so that the output terminal 43 holds its logic level until such time as the clock input 41 is applied to the clock terminal 42, when a new logic state (which may be the same as the previous state) appears.

To write into the memory information is applied to write terminals 50 of write latches 51, 51'. The write latches 51, 51' each have a clock input signal 52 applied to a clock input node 53 so that as the clock pulse appears the input 50 becomes stored at the latch output 54. The latch output feeds to a respective single-to-differential write converter circuit 55, 55' having a write enable input 56 which, when enabled, causes the logic state of output terminal 54 to be written to the relevant memory cell via the complementary bitline pair 23, 24.

Figure 2:
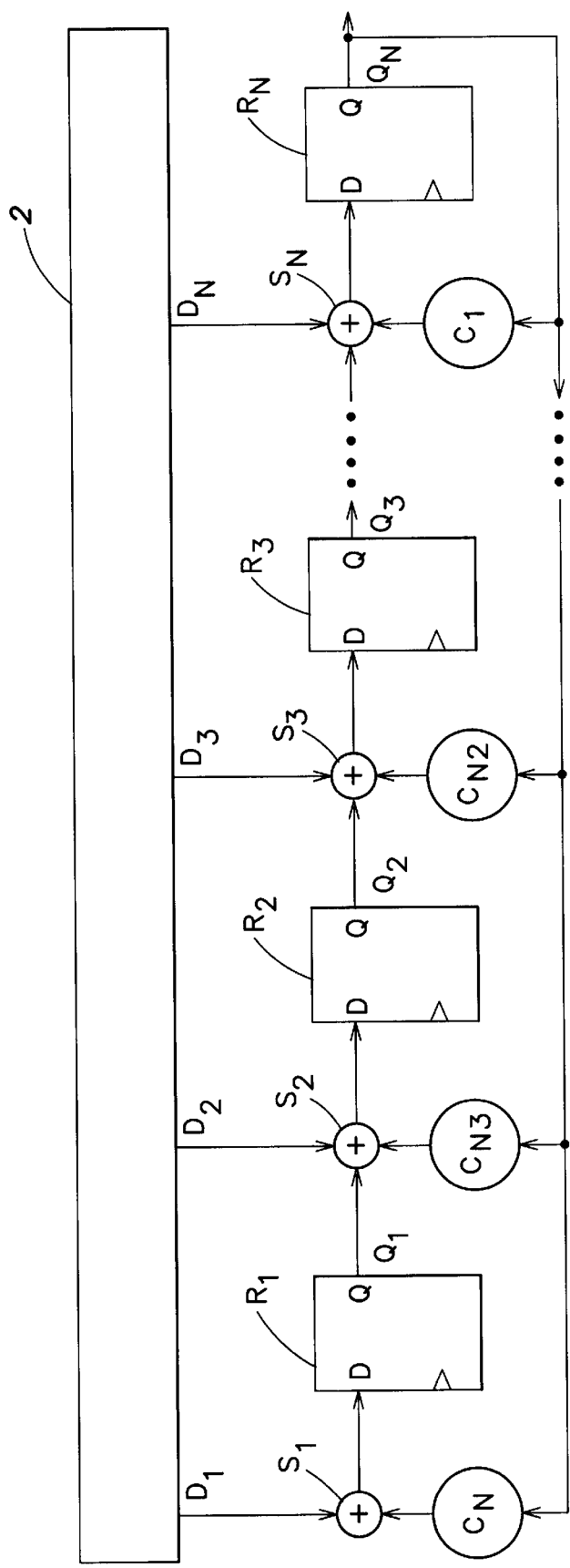
FIG. 2 shows a schematic diagram of an example of signature register.

Referring now to FIG. 2, a signature register for testing a logic circuit, for example, a memory, has a plurality of data inputs, D1–DN each connected to one input of a respective summing circuit S1–SN. The output of each summing circuit feeds to the data input of a respective clocked register R1–RN. A last register RN has an output QN which represents the signature of the circuit under test (and the signature output QN) is fed via a coefficient multiplier CN to the first summing circuit S1. The output of the first register R1 provides a second input to the second summer S2 and this is repeated for the remaining summers, so that each summing circuit except the first receives the output of the previous register. The signature output is fed as a third input, via respective coefficient multipliers C1–CN to each of the second to Nth summers.

The described multiple input signature register is known; other testing circuitry comprising a chain of latches, each latch except the first receiving the logical combination of a data input and the output from a previous latch, is also known. Examples include parity checking circuits.

Figure 3:
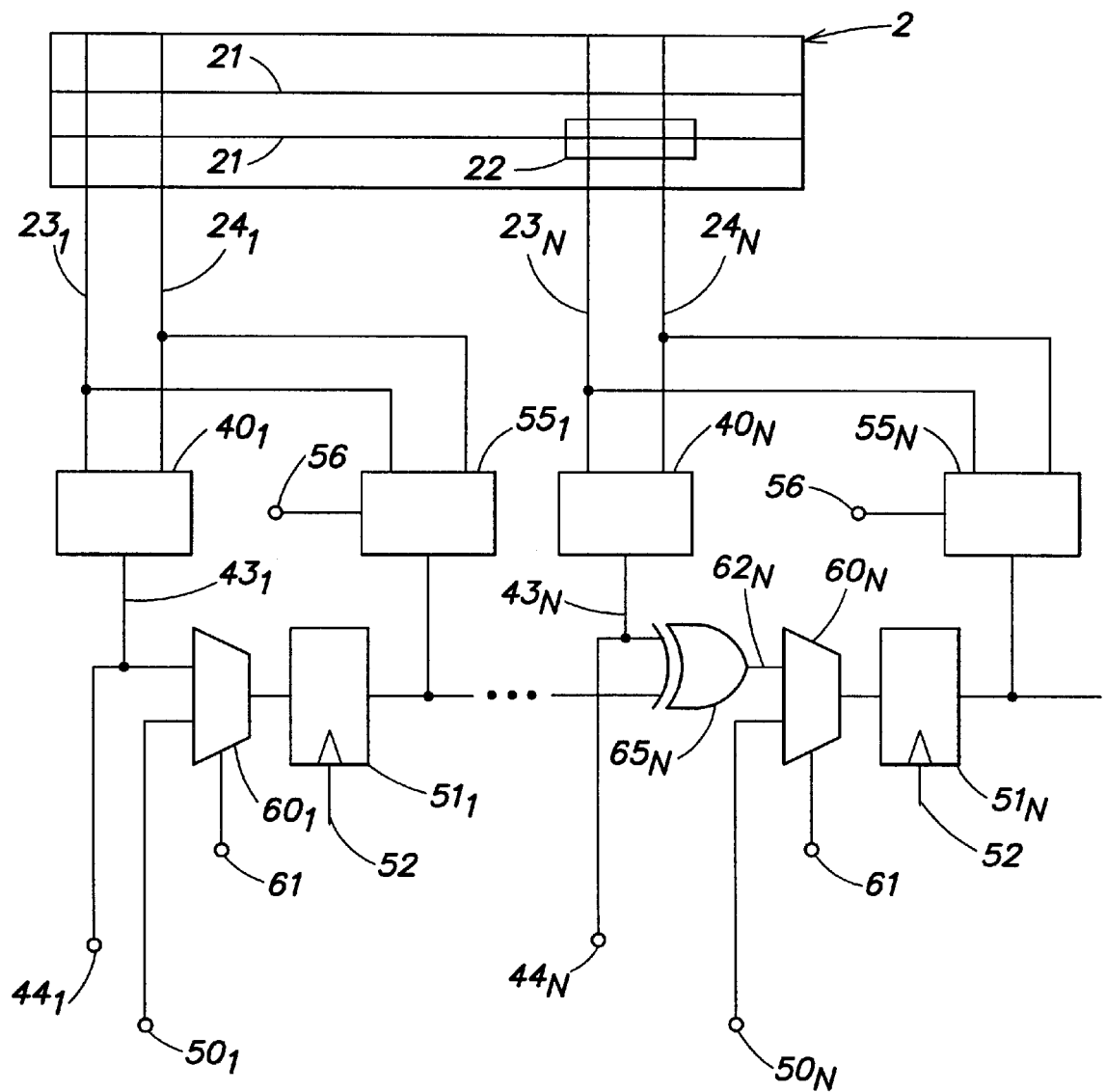
FIG. 3 shows a schematic diagram of a first semiconductor memory circuit in accordance with the invention.

Referring now to FIG. 3, a memory testing arrangement is shown. The memory testing arrangement makes use of circuitry shown in FIG. 1 to provide an alternative function during testing. Thus, the circuitry of FIG. 3 includes plural sense amplifiers $40_1$–$40_N$ each responsive to a respective complementary bitline pair $23_1$, $24_1$ to $23_N$, $24_N$. To each bitline pair there is connected a write circuit $55_1$ to $55_N$ receiving the output of a write data latch $51_1$ to $51_N$. Each write data latch $51_1$–$51_N$ has its input provided from a respective multiplexer $60_1$–$60_N$ and each multiplexer in this embodiment has two inputs. A first input is a write data input $50_1$–$50_N$ and when a control input 61 to each multiplexer is in a first logic state, the write data input is connected to the input of the corresponding write data latch so that after one clock cycle applied to the data latch clock input 52, the data to be written is stored in the latch and is available for the write circuitry $55_1$–$55_N$ to write to the corresponding bitlines under the action of write control 56. A first multiplexer $60_1$ receives at its second input the output $43_1$ from the corresponding sense amplifier $40_1$. All of the remaining multiplexers $60_2$–$60_N$ have their second inputs $62_1$–$62_N$ provided by the output of an XOR circuit $65_1$–$65_N$. Each of the XOR circuits $65_1$–$65_N$ receives two inputs, one from the corresponding sense amplifier output $43_2$–$43_N$ and the other as the output from the immediately preceding write data latch in the chain. The outputs $43_1$–$43_N$ of the sense amplifiers are provided at terminals $44_1$–$44_N$ connected directly thereto. It would alternatively be possible for the terminals $44_1$–$44_N$ to be coupled to the multiplexer outputs, or the latch outputs.

When the multiplexer control signal is set to its opposite state, the second multiplexer input is connected to the multiplexer output in each case and the write data latches than, in cooperation with the XOR gates operate as a parity checking circuit for memory test purposes. It will be noted that because the memory is not in a write mode when testing occurs, there is no effect on the bitlines state via the write circuitry $55_1$–$55_N$; likewise when the multiplexers $60_1$–$60_N$ are in their normal state the memory test circuitry operates as a conventional write arrangement.

Figure 4:
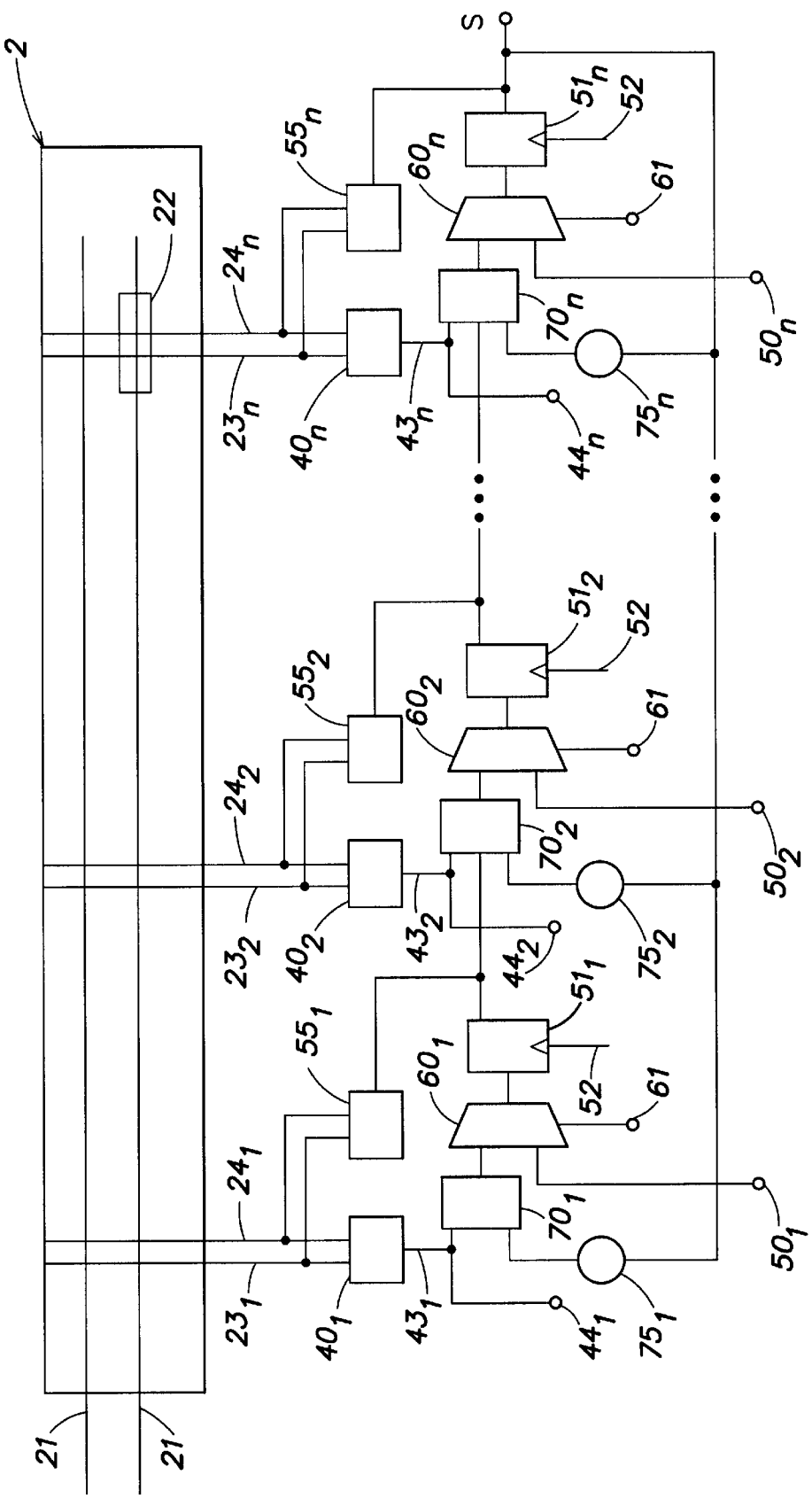
FIG. 4 shows a schematic diagram of a second semiconductor memory circuit in accordance with the invention.

Referring to FIG. 4 a second memory circuit arrangement likewise has a first mode selected by the multiplexer control signal 61 in which is operates as a conventional write arrangement.

Continuing to refer to FIG. 4, in this circuit the output $43_1$–$43_N$ of the sense amplifiers $40_1$–$40_N$ feeds to a logic circuit $70_1$–$70_N$ which provides the second input to the multiplexer $60_1$–$60_N$. A second input to each logic circuit $70_1$–$70_N$ is derived from a signature output S which is the output of the last write data latch $51_N$, the connection from the signature output S to each second input of a logic circuit $70_1$–$70_N$ being via a respective coefficient multiplier $75_1$–$75_N$. The first logic circuit $70_1$ receives only inputs from its associated sense amplifier output $43_1$ and its associated coefficient multiplier $75_1$. All other logic circuits $70_2$–$70_N$ likewise receive inputs from their associated sense amplifier output $43_2$–$43_N$ and their associated coefficient multiplier $75_2$–$75_N$, but also receive a third input from the immediately preceding write data latch $51_1$–$51_{N-1}$. In this arrangement, the sequential signature signal at output S is determined by not only the output of the spatially preceding bitline pair in each case, but also by the past value of the signature signal, due to the feedback of the signature to the various logic circuits.

The two arrangements described with respect to FIG. 3 and FIG. 4 are in some way analogous to infinite impulse response digital filters in the case of FIG. 3 and infinite impulse response filters in the case of FIG. 4.

It will be appreciated that the arrangements described in respect of FIG. 3 and FIG. 4 are purely exemplary and that other signature registers and similar testing circuitry could be realized, as a second alternative use of the data registers of a memory.

What is claimed is:

1. A memory circuit having a plurality of complementary bitlines, providing bitline pairs, each bitline pair holding a logic state, a corresponding plurality of sense amplifiers for evaluating the corresponding logic state of each said bitline pair, each sense amplifier having an output, and a corresponding plurality of data latches for storing data to be written to said bitline pairs, wherein each data latch has an input and output, the circuit further comprising a respective multiplexer connected to each data latch input, a first input of said multiplexer being responsive to the output of a respective other of said plurality of data latches, and a second input of said multiplexer receiving said data to be written said multiplexer selectively having a first and second state whereby in said first state of said multiplexer said data latches are connected to form a test register.

2. The memory circuit of claim 1 wherein one of said multiplexers has an input responsive to an output of a corresponding sense amplifier.

3. The memory circuit of claim 1 further comprising a corresponding plurality of logic circuits, each having an output connected to the first input of a respective one of said multiplexers, a first input receiving the output of said respective other data latch and a second input receiving said output of the corresponding sense amplifier.

4. The memory circuit of claim 3 wherein said plurality of data latches include a last data latch, the memory circuit being operable to provide, at the output of the last data latch, a signature output, wherein each said logic circuit has a third input responsive to said signature output.

5. A method of operating a memory circuit having plural complimentary bitlines providing bitline pairs, each bitline pair holding a logic state, a corresponding plurality of sense amplifiers for evaluating the corresponding logic state of each said bitline pair, each sense amplifier having an output, and a corresponding plurality of data latches for storing data to be written to said bitline pairs, wherein each data latch has an input and output; and all but the first of said data latches has a preceding data latch also with an input and output, each data latch comprising:

in a first mode providing data to be written to said memory at an input of each said data latch, whereby said data is written to said memory; in a test mode, connecting to input of each data latch to the output of a preceding data latch.

6. The method of claim 5 wherein in said test mode, said input of each data latch is further responsive to the output of the corresponding sense amplifier.

* * * * *

UNITED STATES PATENT AND TRADEMARK OFFICE
CERTIFICATE OF CORRECTION

PATENT NO. : 6,580,648 B1
DATED : June 17, 2003
INVENTOR(S) : William Bryan Barnes It is certified that error appears in the above-identified patent and that said Letters Patent is hereby corrected as shown below:

<u>Column 4,</u>
Lines 66-67, should read:
-- has a preceding data latch also with an input and output, the method comprising: --

Signed and Sealed this

Twelfth Day of October, 2004

JON W. DUDAS
*Director of the United States Patent and Trademark Office*